(12) United States Patent
David

(10) Patent No.: US 11,106,235 B2
(45) Date of Patent: Aug. 31, 2021

(54) CONFIGURABLE CLOCK BUFFER FOR MULTIPLE OPERATING MODES

(71) Applicant: Silicon Laboratories Inc., Austin, TX (US)

(72) Inventor: Thomas Saroshan David, Lakeway, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/569,991

(22) Filed: Sep. 13, 2019

(65) Prior Publication Data

US 2021/0080993 A1    Mar. 18, 2021

(51) Int. Cl.
*G06F 1/08*        (2006.01)
*H03K 17/687*    (2006.01)

(52) U.S. Cl.
CPC ............ *G06F 1/08* (2013.01); *H03K 17/6871* (2013.01); *H03K 2217/0054* (2013.01)

(58) Field of Classification Search
CPC .. G06F 1/08; H03K 17/6871; H03K 17/6872; H03K 17/6874; H03K 2217/0054
See application file for complete search history.

(56) References Cited

U.S. PATENT DOCUMENTS

| 4,985,703 | A | * | 1/1991 | Kaneyama | ........... | H03K 17/161 |
| | | | | | | 327/408 |
| 6,518,813 | B1 | * | 2/2003 | Usui | ......................... | G06F 1/08 |
| | | | | | | 327/291 |
| 7,272,534 | B2 | * | 9/2007 | Bleakley | .......... | G01R 31/31709 |
| | | | | | | 702/185 |
| 7,514,955 | B2 | * | 4/2009 | Kim | ....................... | G11C 5/063 |
| | | | | | | 326/29 |
| 2017/0250695 | A1 | * | 8/2017 | Lee | ......................... | H03L 7/091 |

OTHER PUBLICATIONS

Jain, et al. "Dynamically Adaptable Pipeline for Energy-Efficient Microarchitectures Under Wide Voltage Scaling." IEEE Journal of Solid-State Circuits, Vo.53, No. 2, Feb. 2018 pp. 1-10.

(Continued)

*Primary Examiner* — Patrick C Chen
(74) *Attorney, Agent, or Firm* — Gary Stanford; Huffman Law Group, PC

(57) ABSTRACT

A configurable clock buffer including first and second buffers and isolation circuitry. The first buffer has an input coupled to a clock input node and has an output coupled to a clock output node. The second buffer has an input coupled to an intermediate input node and has an output coupled to an intermediate output node. The isolation circuitry is responsive to at least one mode signal, in which it electrically couples the intermediate input node to the clock input node and electrically couples the intermediate output node to the clock output node when the at least one mode signal is in a first state, and in which it electrically couples the intermediate input node to a static node and electrically isolates the intermediate output node from the clock output node when the at least one mode signal is in a second state.

18 Claims, 3 Drawing Sheets

(56) References Cited

OTHER PUBLICATIONS

Lin, et al. "Reconfigurable Clock Networks for Random Skew Mitigation from Subthreshold to Nominal Voltage." IEEE International Solid-State Circuits Conference, 2017 Session 26, Processor-Power Management and Clocking. pp. 1-3.

Lin et al. "A 595pW 14pJ/Cycle Microcontroller with Dual-Mode Standard Cells and Self-Startup for Battery-Indifferent Distributed Sensing." IEEE International Solid-State Circuits Conference, 2018. Session 2, Processors, 2.6. pp. 1-3.

Massimo, Alioto. "Survival of the Fittest: Circuits and Architectures with Wide Power-Performance Adaptation—Beyond Voltage Scaling and Down to pWs." Apr. 28, 2019. Slides 19-28. National University of Singapore (NUS) ECE Department Green IC group.

\* cited by examiner

CONFIGURABLE CLOCK BUFFER FOR MULTIPLE OPERATING MODES

BACKGROUND OF THE INVENTION

Field of the Invention

The present invention relates in general to clock buffers, and more particularly to a configurable clock buffer for multiple operating modes.

Description of the Related Art

Clock buffers are distributed across a semiconductor device or integrated circuit (IC) to deliver a clock signal to various portions of the chip. Clock buffers are sized based on circuitry needs, drive capacity, and mode of operation. The clock tree may include a significant number of large clock buffers that are optimally sized for operation at a "normal" source voltage and normal operating frequency of the chip. Smaller buffers tend to run slower under these normal operating conditions so that larger clock buffers are used to optimize performance at the normal operating conditions. Once the semiconductor device was fabricated, the size of the clock buffers remained unmodified in the conventional configuration.

It is often desired to include one or more high performance modes to improve performance under certain operating conditions. The device may be operated, for example, at twice the normal frequency during a high performance mode to achieve certain operating functions. In order to operate at a higher frequency level, the source voltage may also be increased to ensure reliable operation. The large clock buffers, however, became oversized for operation during the high performance mode and consumed an appreciable amount of power. The power consumption during the high performance mode was often as much as twice the power consumption or more as compared to the normal mode. When the high performance mode is used on a regular basis, power consumption becomes an important factor since it may significantly impact battery life.

SUMMARY OF THE INVENTION

A configurable clock buffer according to one embodiment includes first and second buffers and isolation circuitry. The first buffer has an input coupled to a clock input node and has an output coupled to a clock output node. The second buffer has an input coupled to an intermediate input node and has an output coupled to an intermediate output node. The isolation circuitry is responsive to at least one mode signal, in which it electrically couples the intermediate input node to the clock input node and electrically couples the intermediate output node to the clock output node when the at least one mode signal is in a first state, and in which it electrically couples the intermediate input node to a static node and electrically isolates the intermediate output node from the clock output node when the at least one mode signal is in a second state.

The mode signal(s) may be in the first state for a normal operating mode and in the second state for a high performance operating mode. The high performance operating mode is operated at a higher frequency level in which the first buffer has a size that is suitable for operation in the high performance mode, so that the second buffer is isolated and turned off in the high performance operating mode. The high performance mode may include an increased source voltage level. The first and second buffers have a combined size that is suitable for operation in the normal operating mode and thus are coupled in parallel during the normal operating mode.

The first and second buffers may have equivalent sizes or may have different sizes. The isolation circuitry may include first and second pass gates and a pull down device. The first pass gate is coupled between the clock input node and the intermediate input node, the second pass gate is coupled between the clock output node and the intermediate output node, and the pull down device is coupled between the clock input node and the static node. The static node may be a voltage supply reference node.

A semiconductor device according to one embodiment includes mode circuitry that provides at least one mode signal and a clock tree including multiple clock buffers that distribute a clock signal throughout integrated circuitry of the semiconductor device. Each clock buffer includes a first buffer having an input coupled to a corresponding one of multiple clock input nodes and having an output coupled to a corresponding one of multiple clock output nodes, a second buffer having an input coupled to a corresponding one of multiple intermediate input nodes and having an output coupled to a corresponding one of multiple intermediate output nodes, and isolation circuitry. The isolation circuitry is responsive to the at least one mode signal in which it electrically couples the corresponding intermediate input node to the corresponding clock input node and electrically couples the corresponding intermediate output node to the corresponding clock output node when the at least one mode signal is in a first state, and which it electrically couples the corresponding intermediate input node to a static node and electrically isolates the corresponding intermediate output node from the corresponding clock output node when the at least one mode signal is in a second state.

A processing system according to one embodiment includes a processing device and supporting circuitry. The processing device includes mode circuitry and a clock tree. The mode circuitry indicates a frequency level of a clock signal for a selected one of multiple operating modes, and provides at least one mode signal indicative thereof. The clock tree includes multiple clock buffers that distribute the clock signal throughout the processing device. Each clock buffer includes first and second buffers and isolation circuitry as previously described. The supporting circuitry is responsive to the mode circuitry in which it provides the clock signal at an indicated frequency level.

BRIEF DESCRIPTION OF THE DRAWINGS

The present invention is illustrated by way of example and is not limited by the accompanying figures in which like references indicate similar elements. Elements in the figures are illustrated for simplicity and clarity and have not necessarily been drawn to scale.

DETAILED DESCRIPTION

The inventor has recognized the inefficiency of the clock tree of a conventional semiconductor processing device implemented with large clock buffers. In particular, the large clock buffers, which are optimally sized for normal operation, nonetheless consume a substantial amount of power during a high performance mode of operation. He has recognized that the large clock buffers become effectively oversized for higher frequency and voltage levels of the high performance mode of operation. He has therefore developed a configurable clock buffer that may be used to implement the large clock buffers of the semiconductor device. The size of the configurable clock buffers remain unmodified during the normal mode, but are reduced in size during the high performance mode. The size reduction of the configurable clock buffers during the high performance mode result in significantly less power consumption compared to the conventional case in which the size of the buffers remained unmodified.

Figure 1:
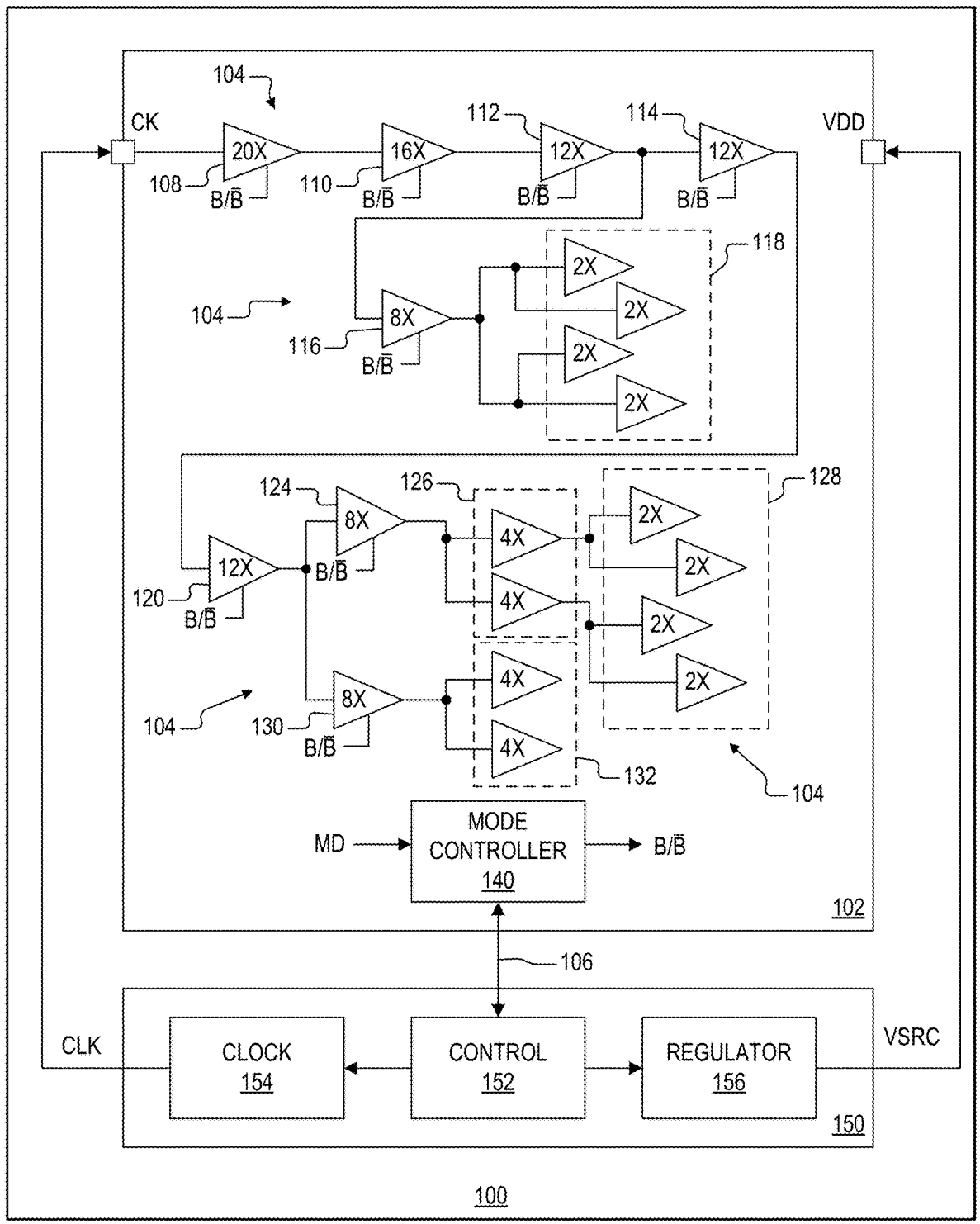
FIG. 1 is a simplified block diagram of a processing system including a processing device with a clock tree distributing one or more configurable clock buffers for multiple operating modes according to one embodiment of the present disclosure.

FIG. 1 is a simplified block diagram of a processing system 100 including a processing device 102 with a clock tree 104 distributing one or more configurable clock buffers for multiple operating modes according to one embodiment of the present disclosure. The processing system 100 includes the processing device 102 and may include external supporting circuitry 150. The processing system 100 may be configured for any one of many different types of applications and may be implemented using a discrete design or as part of a system on chip (SoC) design. As a non-limiting example, the processing system 100 may be configured with a radio transceiver (not shown) operating according to the Bluetooth Low Energy (BLE) protocol for an application in any one of healthcare, fitness, beacons, security, home entertainment, Internet of Things (IoT), etc. BLE is a low energy wireless personal area network technology for communicating with nearby devices.

The processing device 102 may be implemented as a separate semiconductor device or integrated circuit (IC) having a clock input CK receiving at least one clock signal CLK and a source voltage input VDD receiving at least one source voltage VSRC. The processing device 102 may be configured according to any technology or architecture or the like, such as a microprocessor, a central processing unit (CPU), a microcontroller, etc. The clock tree 104 distributes the CLK signal to different portions and to different circuitry integrated on the processing device 102. The clock tree 104 includes multiple clock buffers, each having an input for receiving an input clock signal from either the clock input CK or from the output of another clock buffer, and each having an output for providing an output clock signal to one or more other clock buffers and/or to clocked devices (not shown), such as flip-flops, latches, state machines, etc.

Larger ones of the clock buffers include a mode input receiving at least one buffer mode signal B. The buffer mode signal B may be provided as complementary binary signals B and $\overline{B}$, in which $\overline{B}$ is an inverted version of B (so that when B is high, $\overline{B}$ is low and vice-versa). In an alternative embodiment, only one buffer mode signal may be distributed to one or more of the clock buffers which include an inverter (not shown) receiving B and providing $\overline{B}$. The particular layout of the illustrated clock tree 104 is exemplary only in which many different clock tree configurations are possible and contemplated. The distribution of the clock tree 104 depends upon the particular configuration and layout of the processing device 102. Each clock buffer is illustrated as non-inverting, in which is it understood that any one or more of the clock buffers may be inverting.

In the particular configuration illustrated, the clock input CK is coupled to the input of a 20X clock buffer 108, in which the notation "20X" indicates its relative size. The size of each clock buffer depends upon the local circuitry and/or any other clock buffers that the clock buffer is driving. The size of each clock buffer 108 is relative to a unit-sized clock buffer having a size of 1x, in which the sizes of larger clock buffers are expressed as a multiple of X, such as 1X, 2X, 3X, 4X, 6X, 8X, 16X, 20X, etc. In CMOS parlance, a typical 1X clock buffer may include one P-type device and one N-type device, a 2X clock buffer may include 2 P-type devices and 2 N-type devices, and so on. The unit size (e.g., 1X) may differ from technology to technology and library to library. The size of each clock buffer refers to its relative strength which generally translates to the amount of current drive capacity at its output. Although the size and strength of a clock buffer may be increased by placing smaller buffers in parallel, most semiconductor tools and libraries do not support this methodology. Instead, most libraries provide a variety of clock buffer sizes.

The output of the 20X clock buffer 108 is coupled to the input of a 16X clock buffer 110, having its output coupled to the input of a 12X clock buffer 112, which in turn has its output coupled to the input of another 12X clock buffer 114. The output of the 12X clock buffer 112 is also coupled to the input of an 8X clock buffer 116, having its output driving each of a set of four 2X clock buffers 118. The output of the 12X clock buffer 114 is coupled to the input of another 12X clock buffer 120, which has its output coupled to the inputs of two 8X clock buffers 124 and 130. The output of the 8X clock buffer 124 drives a pair of 4X clock buffers 126, which in turn drives a set of four 2X clock buffers 128. The output of the 8X clock buffer 130 drives a pair of 4X clock buffers 132. Additional clock buffers may be included but are not shown.

The buffer mode signals B and $\overline{B}$ are provided to mode inputs of the large clock buffers 108, 110, 112, 114, 116, 120, 124, and 130. These larger clock buffers are configurable based on the state of the buffer mode signals B and B as further described herein. The smaller clock buffers, including the 4X and 2X clock buffers 118, 126, 128, and 132 are not configurable and thus remain unchanged between the different operating modes. In an alternative embodiment, the smaller clock buffers 2X and 4X may also be made configurable. The decision of determining which clock buffers are configurable depends on the relative power payback achieved. The smaller clock buffers have less power payback as compared to the larger clock buffers so that it may not be worth the additional configuration circuitry and distribution of the buffer mode signals B and $\overline{B}$ to the smaller clock buffers. Although not shown, 6X clock buffers may also be included in which a power payback analysis may be made to determine whether to implement any 6X clock buffers as configurable or not. The reduction of power consumption for the high performance operating mode is greater for the larger clock buffers, such as those having a size of 8X or more (or 6X or more).

The processing device 102 further includes a mode controller 140 receiving a mode signal MD and providing the buffer mode signals B and B̄. The MD signal may be provided from other circuitry (not shown) that determines the relative performance needed at any given time. As an example, a communication device with a radio transceiver may operate in a high performance mode when the radio is receiving or transmitting. The mode controller 140 selects a corresponding clock frequency needed by the processing device 102 according to the needed performance and communicates with control circuitry 152 of the supporting circuitry 150 via a communication interface 106. The communication interface 106 may be implemented in a suitable format, such as a set of signals in the form of a serial bus or a parallel bus or the like. The control circuitry 152 communicates with clock circuitry 154 of the supporting circuitry 150 to adjust the frequency of CLK accordingly. Furthermore, the mode controller 140 switches the buffer mode signals B and 173 based on the requested performance level to adjust the size of the larger clock buffers (those at least 8X in the illustrated configuration) as further described herein.

In many configurations, the high performance mode may be achieved by increasing the frequency while maintaining the same operating source voltage. In other configurations, operation at the higher frequency may become less reliable at the same source voltage, so that the source voltage may also be increased. When this is the case, as may be empirically determined for given configurations, the control circuitry 152 also communicates with the regulator circuitry 156 (as indicated by the mode controller 140) to adjust the voltage level of VSRC appropriate for the higher frequency level. In addition, multiple high performance modes may be defined at multiple frequency levels, in which the source voltage may or may not be adjusted accordingly for each defined frequency level.

The processing device 102 may be optimally designed for "normal" operation under normal operating conditions including a normal source voltage and a normal operating frequency. The large clock buffers 108, 110, 112, 114, 116, 120, 124, and 130 of clock tree 104 may be sized for optimal operation at the normal source voltage and normal operating frequency. When the mode controller 140 requests a high performance mode requiring a higher frequency of CLK, and possibly a corresponding higher voltage level of VSRC, the normal size of the larger clock buffers become oversized under the new operating conditions and tend to consume a relatively large amount of power. Most of the clock network power is consumed by the large clock buffers, and the power consumption may be increased by a factor of two or more during the high performance mode. Instead, the mode controller 140 switches the buffer mode signals B and B̄ to reduce the size of the large clock buffers 108, 110, 112, 114, 116, 120, 124, and 130 during the high performance mode. In one embodiment, for example, the size of many of the larger clock buffers is reduced by half, thereby reducing the power level consumed by the clock tree 104 during the high performance mode.

As an example, the normal operating voltage may be VDD=1 Volt (V) at a corresponding operating clock frequency of CLK=40 Megahertz (MHz). The high performance mode may be at twice the clock frequency, or CLK=80 MHz, with a corresponding higher operating voltage of VDD=1.1V. If the larger clock buffers of the clock tree 104 were not configurable and thus remained the same size during the high power mode, then the power consumption of the clock tree 104 could be twice or more using the over-sized clock buffers. Instead, the size of the larger clock buffers is reduced by half during the high performance mode which reduces the power consumption by a substantial amount. In a more specific configuration, the power reduction achieved was empirically measured to be at least 40%.

Although the specific example is for twice the frequency, it is understood that higher performance may be achieved by any significant increase of the operating frequency level. The size of the larger clock buffers may be adjusted when they become "oversized" for the particular operating frequency. The source voltage may also be adjusted to ensure reliability of operation at each higher frequency level.

Figure 2:
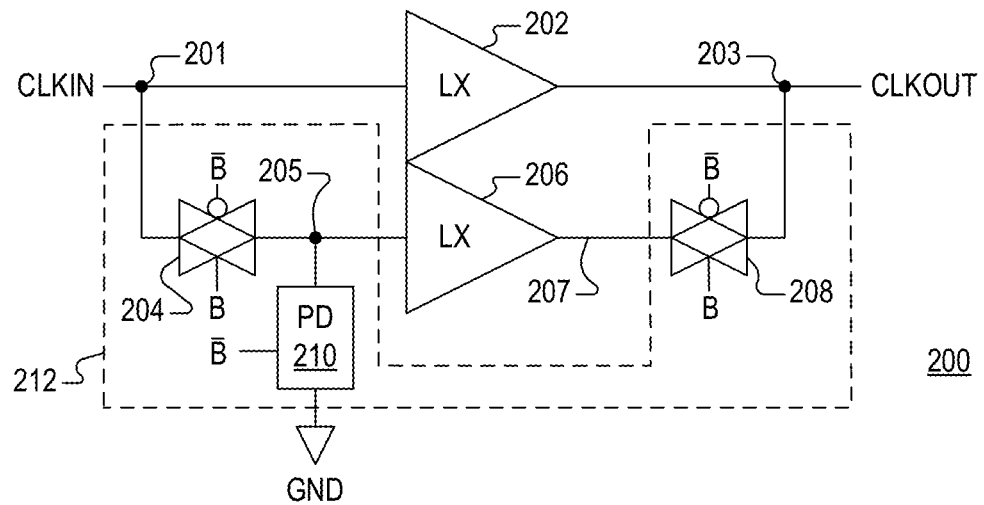
FIG. 2 is a schematic and block diagram of a configurable clock buffer implemented according to one embodiment of the present disclosure for implementing the large clock buffers of the processing device of FIG. 1.

FIG. 2 is a schematic and block diagram of a configurable clock buffer 200 implemented according to one embodiment of the present disclosure for implementing the large clock buffers of the processing device 102, such as the clock buffers 108, 110, 112, 114, 116, 120, 124, and 130 of the clock tree 104. An input clock signal CLKIN is provided to a node 201 coupled to the input of a first buffer 202, which has an output coupled to a node 203 providing an output clock signal CLKOUT. Depending upon the clock buffer and its position in the clock tree 104, CLKIN may be the CLK signal or may be the output of another clock buffer, and CLKOUT may be provided to clocked circuitry and/or the input of one or more other clock buffers. A first pass gate 204 has an input coupled to node 201 for receiving CLKIN, and has an output coupled to a node 205 which is coupled the input of another clock buffer 206. The output of the clock buffer 206 is coupled to a node 207 which is coupled to the input of another pass gate 208 having its output coupled to node 203. A pull down device 210 is coupled between node 205 and a reference node, such as ground (GND). The buffer mode signals B and B̄ are provided to corresponding enable inputs of each of the pass gates 204 and 208, and the inverted buffer mode signal B̄ is provided to an enable input of the pull down device 210. The pass gates 204 and 208 and the pull down device 210 collectively operate as isolation circuitry 212 that operates in two different modes depending upon the state of the buffer mode signals B and B̄, which in turn depend upon the operating mode as further described herein.

The pass gates 204 and 208 may be implemented in any suitable manner, such as pair of FET or MOS transistors coupled in parallel, each controlled by a corresponding one of the buffer mode signals B and B̄. The size of each pass gate 204 and 208 is configured to allow for adequate drive capacity when turned on. The pull down device 210 may be implemented using at least one NFET or NMOS transistor coupled between node 205 and GND with sufficient drive capacity to keep node 205 grounded during operation.

The first and second buffers 202 and 206 each have a size "LX" in which L is a multiplier defining the size of each buffer relative to a unit size "X". L may be an integer greater than zero (e.g., 1 or more). For example, if L=10, then the buffers 202 and 206 are each 10X-sized buffers having a drive capacity that is 10 times that of a unit buffer of size X. L is 10 for the clock buffer 108, L is 8 for the clock buffer 110, L is 6 for the clock buffers 112, 114, and 120, and L is 4 for the clock buffers 116, 124, and 130 of the clock tree 104 of the processing device 102.

In operation of the clock buffer 200, when B is asserted (e.g., pulled high or logic "1") and B̄ is negated (e.g., pulled low or logic "0") for the normal or normal operating mode, then the clock buffer 200 has an overall size of 2LX. In particular, the pass gates 204 and 208 of the isolation circuitry 212 are turned on while the pull down device 210 is turned off effectively coupling the buffers 202 and 206 in parallel. In this configuration, the overall size and drive capacity of the clock buffer 200 is 2LX between CLKIN and CLKOUT. On the other hand, when B is negated and $\overline{B}$ is asserted, then the isolation circuitry 212 effectively removes operation of the buffer 206 from the clock buffer 200. In particular, the pass gates 204 and 208 are turned off isolating the buffer 206 from the buffer 202, and the pull down device 210 is turned on effectively turning off the buffer 206. In this case only the buffer 202 is active so that the overall drive capacity of the clock buffer 200 is LX between CLKIN and CLKOUT. In this manner, the state of the buffer mode signal B (and thus $\overline{B}$), which is determined by the mode of operation, determines whether the drive capacity of the clock buffer 200 is LX or 2LX.

When the clock buffer 200 is used to implement the large clock buffers 108, 110, 112, 114, 116, 120, 124, and 130 of the clock tree 104 of the processing device 102, then when B is asserted (and $\overline{B}$ is negated) during the normal or normal mode, then the corresponding size of the large clock buffers 108, 110, 112, 114, 116, 120, 124, and 130 is 20X, 16X, 12X, 12X, 8X, 12X, 8X, and 8X, respectively (such as depicted in FIG. 1). During the high performance mode, B is negated (and $\overline{B}$ is asserted) so that the size of each of the large clock buffers is reduced by a factor of two, so that the corresponding size of the large clock buffers 108, 110, 112, 114, 116, 120, 124, and 130 is only 10X, 8X, 6X, 6X, 4X, 6X, 4X, and 4X, respectively. The size of each of the smaller clock buffers 118, 126, 128, and 132 remain unmodified. Nonetheless, power consumption during the high performance mode is not increased by the same amount as compared to the conventional case in which the larger buffers are static and non-configurable.

Figure 3:
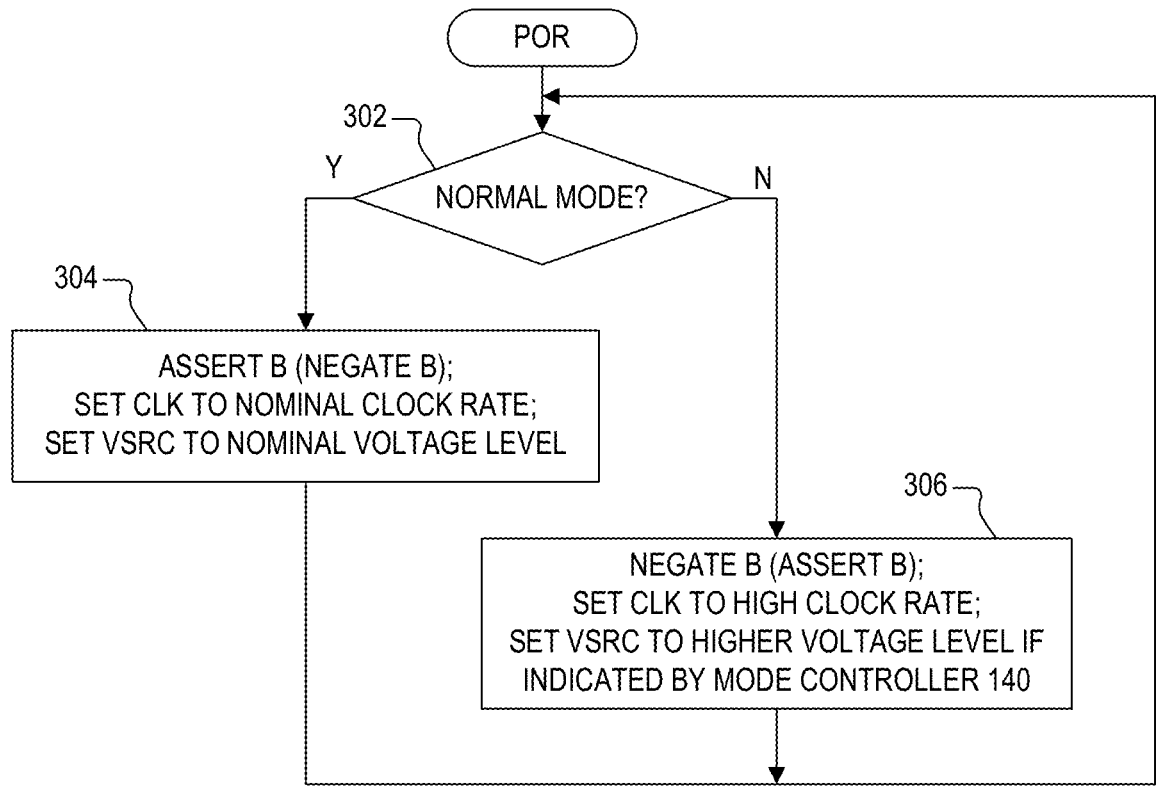
FIG. 3 is a simplified flowchart diagram illustrating operation of the mode controller of FIG. 1 according to one embodiment of the present disclosure.

FIG. 3 is a simplified flowchart diagram illustrating operation of the mode controller 140 according to one embodiment of the present disclosure. After power-on or reset (POR) of the processing system 100 and/or the processor 102, operation proceeds to block 302 to monitor the status of the mode signal MD. If MD indicates the normal mode of operation, then operation proceeds to block 304 in which the mode controller 104 asserts the buffer mode signal B (and thus negates $\overline{B}$) for normal operation, and communicates with the control circuitry 152 of the supporting circuitry 150 to command that the clock circuitry 154 set the frequency of CLK to the normal clock rate and to command that the regulator circuitry 156 set the voltage level of the source voltage VSRC to the normal voltage level. Operation then loops back to block 302 to continue monitoring the MD signal. During the normal mode of operation, the large buffers 108, 110, 112, 114, 116, 120, 124, and 130 of the clock tree 104 of the processing device 102 remain as larger clock buffers with respective sizes 20X, 16X, 12X, 12X, 8X, 12X, 8X, and 8X as previously described.

If the mode signal MD is changed to indicate the high performance mode of operation, then operation proceeds instead to block 306 in which the mode controller 104 negates the buffer mode signal B (and thus asserts $\overline{B}$), and communicates with the control circuitry 152 of the supporting circuitry 150 to command that the clock circuitry 154 set the frequency of CLK to the higher clock rate. If indicated by the mode controller 140, the control circuitry 152 also commands the regulator circuitry 156 to adjust the voltage level of the source voltage VSRC to a higher voltage level. Operation then loops back to block 302 to continue monitoring the MD signal. During the high performance mode of operation, the large buffers 108, 110, 112, 114, 116, 120, 124, and 130 of the clock tree 104 of the processing device 102 are reduced to respective sizes 10X, 8X, 6X, 6X, 4X, 6X, 4X, and 4X as previously described. The power consumption is substantially reduced as compared to the conventional case in which the size of the large clock buffers of the clock tree 104 remain unmodified.

Figure 4:
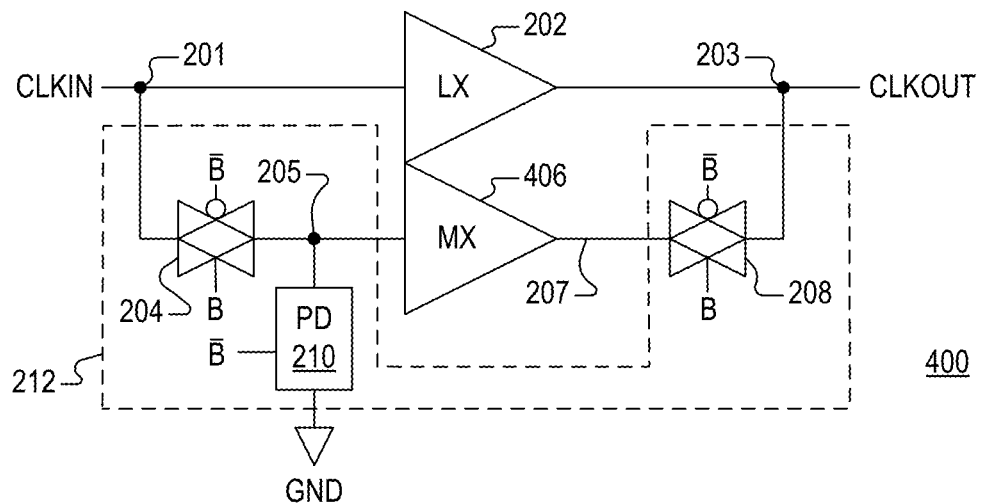
FIG. 4 is a schematic and block diagram of a configurable clock buffer implemented according to another embodiment of the present disclosure for implementing the large clock buffers of the processing device of FIG. 1.

FIG. 4 is a schematic and block diagram of a configurable clock buffer 400 implemented according to another embodiment of the present disclosure for implementing the large clock buffers of the processing device 102, such as the clock buffers 108, 110, 112, 114, 116, 120, 124, and 130 of the clock tree 104. The clock buffer 400 is substantially similar to the clock buffer 200 in which similar components assume identical reference numerals. In the clock buffer 400, the buffer 206 is replaced by a similar buffer 406 having a size "MX" in which M is also an integer multiplier having a value that is the same or different from L. The configurable clock buffer 400 operates in substantially similar manner except that the relative size between the normal mode and the high performance mode may be other than a factor of two. As an example, L may be 4 while M is 2, 3, 4, 5, 6, etc., or L may be 5 while M is 2, 3, 4, 5, 6, 7, etc., and so on. The configurable clock buffer 400 provides a somewhat greater level of flexibility as compared to the configurable clock buffer 200. The isolation circuitry 212 operates in substantially the same manner.

Figure 5:
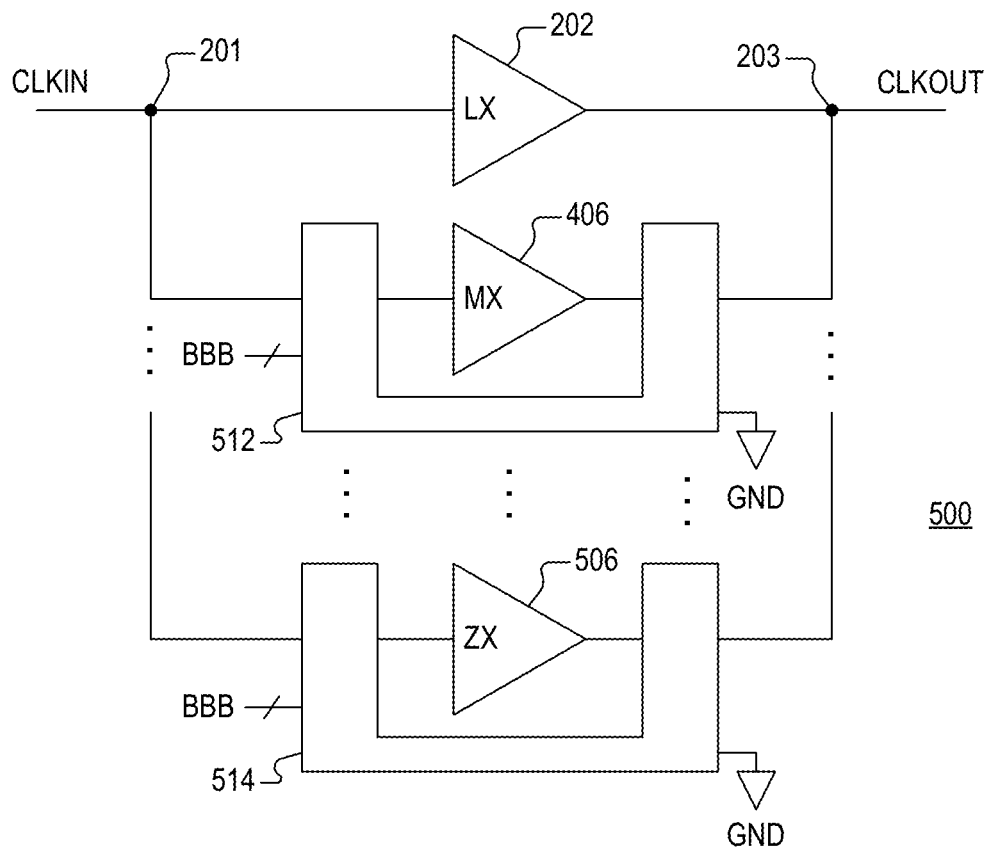
FIG. 5 is a schematic and block diagram of a configurable clock buffer implemented according to yet another embodiment of the present disclosure for implementing the large clock buffers of a processing device having multiple higher performance modes.

FIG. 5 is a schematic and block diagram of a configurable clock buffer 500 implemented according to yet another embodiment of the present disclosure for implementing the large clock buffers of a processing device (not shown) having multiple higher performance modes. The configurable clock buffer 500 may be considered as an extension of the configurable clock buffer 400 including the buffers 202 and 406 coupled between the CLKIN and CLKOUT nodes 201 and 203. The isolation circuitry 212 is replaced by isolation circuitry 512 which operates in a similar manner except responsive to multiple buffer mode signals BBB indicating the particular mode of operation. The mode controller 104 is modified to provide the buffer mode signals BBB based on the mode of operation requested. One or more additional buffers 506 may be included having the same or different size generally represented as "ZX", each additional buffer separately activated by corresponding isolation circuitry 514 based on the state of the digital BBB signal.

BBB includes multiple binary or digital signals and may or may not include inverted buffer mode signals. As an example, BBB may include a first buffer mode signal and its inverted version provided to the isolation circuitry 512 for enabling/disabling the buffer 406, and so on up to a last buffer mode signal and its inverted version provided to the isolation circuitry 514 for enabling/disabling the buffer 506. Alternatively, BBB may be a digital code value provided to a corresponding decoder (not shown) within each isolation circuitry 512, . . . , 514 for providing corresponding buffer mode signals for enabling or disabling the corresponding buffer 406, . . . , 506, respectively. Many possible variations are contemplated.

As an example, consider the configurable clock buffer 500 with 3 separate 4X buffers 202, 406 and 506 (i.e., L=M=Z=4). In a normal mode of operation, BBB activates each of the buffers 202, 406 and 506 so that the configurable clock buffer 500 has a corresponding size of 12X. In a first performance mode of operation at an elevated frequency (and possibly adjusted source voltage), BBB only activates 2 of the buffers, such as buffers 202 and 406, so that the configurable clock buffer 500 has a corresponding size of 8X. In a second performance mode of operation at an even higher frequency (and again, possibly adjusted source voltage), BBB only activates the buffer 202 so that the configurable clock buffer 500 has a corresponding size of 4X.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes without departing from the spirit and scope of the invention.

The invention claimed is:

1. A configurable clock buffer, comprising:
   a first buffer having an input coupled to a clock input node and having an output coupled to a clock output node;
   a second buffer having an input coupled to an intermediate input node and having an output coupled to an intermediate output node; and
   isolation circuitry responsive to at least one mode signal that electrically couples the intermediate input node to the clock input node and electrically couples the intermediate output node to the clock output node when the at least one mode signal is in a first state for a normal operating mode at a first frequency level to couple the first and second buffers in parallel, and that electrically isolates the intermediate input node from the clock input node and electrically isolates the intermediate output node from the clock output node when the at least one mode signal is in a second state for a high performance operating mode at a second frequency level that is greater than the first frequency level.

2. The configurable clock buffer of claim 1, wherein the first buffer has a size for operation in the high performance operating mode, and wherein the first and second buffers have a combined size for operation in the normal operating mode.

3. The configurable clock buffer of claim 2, wherein the high performance operating mode comprises an increased source voltage level.

4. The configurable clock buffer of claim 1, wherein the first and second buffers have equivalent sizes.

5. The configurable clock buffer of claim 1, wherein the first and second buffers have different sizes.

6. The configurable clock buffer of claim 1, wherein the isolation circuitry comprises:
   a first pass gate coupled between the clock input node and the intermediate input node;
   a second pass gate coupled between the clock output node and the intermediate output node; and
   a pull down device coupled between the clock input node and the static node.

7. The configurable clock buffer of claim 6, wherein the static node comprises a voltage supply reference node.

8. A semiconductor device, comprising:
   mode circuitry that provides at least one mode signal; and
   a clock tree comprising a plurality of clock buffers that distribute a clock signal throughout integrated circuitry of the semiconductor device, wherein each of the plurality of clock buffers comprises:
      a first buffer having an input coupled to a corresponding one of a plurality of clock input nodes and having an output coupled to a corresponding one of a plurality of clock output nodes;
      a second buffer having an input coupled to a corresponding one of a plurality of intermediate input nodes and having an output coupled to a corresponding one of a plurality of intermediate output nodes; and
      isolation circuitry responsive to the at least one mode signal that electrically couples the corresponding intermediate input node to the corresponding clock input node and electrically couples the corresponding intermediate output node to the corresponding clock output node when the at least one mode signal is in a first state for a normal operating mode at a first frequency level to couple the first and second buffers in parallel, and that electrically isolates the corresponding intermediate input node from the corresponding clock input node and electrically isolates the corresponding intermediate output node from the corresponding clock output node when the at least one mode signal is in a second state for a high performance operating mode at a second frequency level that is greater than the first frequency level.

9. The semiconductor device of claim 8, wherein the first buffer of each of the plurality of clock buffers has a size for operation in the high performance operating mode, and wherein the first and second buffers of each of the plurality of clock buffers have a combined size for operation in the normal operating mode.

10. The semiconductor device of claim 9, wherein the high performance operating mode comprises an increased source voltage level.

11. The semiconductor device of claim 8, wherein the first and second buffers of each of the plurality of clock buffers have equivalent sizes.

12. The semiconductor device of claim 8, wherein the first and second buffers of each of the plurality of clock buffers have different sizes.

13. The semiconductor device of claim 8, wherein the isolation circuitry of each of the plurality of clock buffers comprises:
   a first pass gate coupled between the corresponding clock input node and the corresponding intermediate input node;
   a second pass gate coupled between the corresponding clock output node and the corresponding intermediate output node; and
   a pull down device coupled between the corresponding clock input node and the static node.

14. The semiconductor device of claim 13, wherein the static node comprises a voltage supply reference node.

15. A processing system, comprising:
   a processing device, comprising:
      mode circuitry that indicates a frequency level of a clock signal for a selected one of a plurality of operating modes, and that provides at least one mode signal indicative thereof; and
      a clock tree comprising a plurality of clock buffers that distribute the clock signal throughout the processing device, wherein each of the plurality of clock buffers comprises:
         a first buffer having an input coupled to a corresponding one of a plurality of clock input nodes and having an output coupled to a corresponding one of a plurality of clock output nodes;

a second buffer having an input coupled to a corresponding one of a plurality of intermediate input nodes and having an output coupled to a corresponding one of a plurality of intermediate output nodes; and isolation circuitry responsive to the at least one mode signal that electrically couples the corresponding intermediate input node to the corresponding clock input node and electrically couples the corresponding intermediate output node to the corresponding clock output node when the at least one mode signal is in a first state for a normal operating mode at a first frequency level to couple the first and second buffers in parallel, and that electrically isolates the corresponding intermediate input node from the corresponding clock input node and electrically isolates the corresponding intermediate output node from the corresponding clock output node when the at least one mode signal is in a second state for a high performance operating mode at a second frequency level that is greater than the first frequency level; and supporting circuitry responsive to the mode circuitry that provides the clock signal at an indicated frequency level.

16. The processing system of claim 15, wherein when the mode circuitry indicates the frequency level for the normal mode and provides at least one mode signal indicative of the normal mode in which the first and second buffers of each of the plurality of clock buffers are coupled together with a combined size, and wherein when the mode circuitry indicates the frequency level for the high performance mode and provides at least one mode signal indicative of the high performance mode in which the second buffer of each of the plurality of clock buffers is isolated and turned off.

17. The processing system of claim 15, wherein the first and second buffers of each of the plurality of clock buffers have equivalent sizes.

18. The processing system of claim 15, wherein the isolation circuitry of each of the plurality of clock buffers comprises:
- a first pass gate coupled between the corresponding clock input node and the corresponding intermediate input node;
- a second pass gate coupled between the corresponding clock output node and the corresponding intermediate output node; and
- a pull down device coupled between the corresponding clock input node and the static node.

* * * * *